US008855992B1

(12) United States Patent
Li et al.

(10) Patent No.: US 8,855,992 B1
(45) Date of Patent: Oct. 7, 2014

(54) GRAPHICAL MODELING BLOCKS THAT EXECUTE IN MORE THAN ONE DOMAIN

(75) Inventors: Wei Li, Framingham, MA (US); John Edward Ciolfi, Wellesley, MA (US); Michael I. Clune, Natick, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 13/565,921

(22) Filed: Aug. 3, 2012

Related U.S. Application Data

(60) Division of application No. 12/723,271, filed on Mar. 12, 2010, which is a continuation-in-part of application No. 11/024,148, filed on Dec. 21, 2004, now Pat. No. 7,925,477.

(60) Provisional application No. 60/611,571, filed on Sep. 20, 2004.

(51) Int. Cl.
*G06G 7/62* (2006.01)

(52) U.S. Cl.
USPC ............................................................ 703/13

(58) Field of Classification Search
CPC ............................... G06F 17/5009; G06F 8/34
See application file for complete search history.

(56) References Cited

U.S. PATENT DOCUMENTS 4,985,860 A 1/1991 Vlach
5,301,301 A 4/1994 Kodosky et al.

OTHER PUBLICATIONS

The Mathworks, "Stateflow and Stateflow Coder User's Guide", Version 5, Jan. 2003, 896 pages.*
Anylogic User's Manual, XJ Technologies Company Ltd., 1992-2004; pp. 2-4, 8-9, 21-3, 41-3, 55-7, 155-6, 218-21, 270-1.
Bailey, Stephen A. et al., "1076.1 Ballot Resolution Committee, Comment Resolution Report," retrieved online at http://www.eda.org/vhdl-ams-ftp__files/lang__design/BRC/CRR15__Meta__issues.txt (2005).
Ballot Resolution Committee, "Meta issues," http://www.eda.org/vhdl-ams/ftp__files/lang__design/BRC/CRR15__Meta__issues.txt, 1-10 (1998).
Berkeley.edu, Ptolemy II Frequently Asked Questions, retrieved online at http://ptolemy.eecs.berkeley.edu/ptolemyII/ptIIfaq.htm (2005).
Boydstun, Frank et al., "New Perspectives Towards Modeling Depot MRO," Proceedings of the 2002 Winter Simulation Conference, vol. 1:738-746 (2002).
Charfi, F. et al., "Two Novel Modeling Methodologies for IGBT Transistor," IEEE 2002 28th Annual Conference of the IECON, vol. 1:550-554 (2002).

(Continued)

*Primary Examiner* — Suzanne Lo
(74) *Attorney, Agent, or Firm* — Harrity & Harrity, LLP

(57) ABSTRACT

A time-driven block provided in a block diagram model may be executed in an event domain without user modification. The time-driven block is connected to one or more event-driven blocks using event domain signals. The time-driven block automatically adapts to the execution rules of the event domain modeling and simulation environment. The blocks that are configured to execute in more than one modeling and simulation environments are called polymorphic blocks. The polymorphic blocks are identified during the compilation stage of the block diagram model taking into consideration the port and line styles of the blocks. The execution rules of the polymorphic blocks are also determined during the compilation stage of the block diagram model.

20 Claims, 7 Drawing Sheets

(56) References Cited

OTHER PUBLICATIONS

Chen, Gilbert et al., "Lookahead, Rollback and Lookback: Searching for Parallelism in Discrete Event Simulation," retrieved online at http://citeseer.ist.psu.edu/551717.html (2002).
Clune, M., et al., "Panel session on, Challenges and solution techniques for hybrid simulation," 43rd IEEE Conference on Decision and Control, Dec. 14, 2004.
Connell, Jon et al., "Early Hardware/Software Integration Using SystemC 2.0," retrieved online at http://www.synopsys.com/products/designware/system_studio/esc_paper_552.pdf (2002).
Dempsey, Mike, "Automatic translation of Simulink models into Modelica using Simelica and the AdvancedBlocks library," The Modelica Association, 11 pages (2003).
Deparade, André et al., "Integration and Synchronization of Discrete Formalisms and Continuous Models in Modelica," Proceedings of the 2002 IEEE International Conference no Control Applications, vol. 2:1189-1194 (2002).
Diamond, Bob et al., "EXTEND, User's Manual, Version 4, For Macintosh or Windows," Imagine That, Inc., (1997).
Dynasim AB, "Dymola, Dynamic Modeling Laboratory, User's Manual," Version 5.0, 39 pages, (1992-2002).
Fall, K., et al., "The ns manual (formerly ns notes and documentation)," The VINT Project, Apr. 14, 2005; Chapters 4-8, pp. 37-85, Chapter 11, pp. 110-114.
Franck, Andreas et al., "A Combined Continuous-Time/Discrete-Event Computation Model for Heterogeneous Simulation Systems," APPT 2003, LNCS 2834, X. Zhou et al. (Eds.), Springer-Verlag, Berlin, Heidelberg, pp. 565-576 (2003).
Frey, Georg, "Simulation of Hybrid Systems Based on Interpreted Petri Nets," Proceedings of the IEEE International Conference on Simulation—Innovation Through Simulation, pp. 168-175 (1998).
Fujimoto, R., "Parallel discrete event simulation," Communications of the ACM, Oct. 1990: 1-8.
Grand Valley State University, "20. Sequential Function Charts," retrieved online at http://www.eod.gvsu.edu/~jackh/books/plcs/chapters/plc_sfc.pdf (2007).
Grötker, Thorsten "System C , Transaction Level Modeling with SystemC," Synopsys, Inc., retrieved online at http://www.google.com/search?hl=en&q=grotker+SystemC%2C+Transaction+Level+Modeling+with+SystemC&aq=f&oq=&aqi= (2002).
Haverinen, Anssi et al., "White Paper for SystemC™ based SoC Communication Modeling for the OCP™ Protocol," retrieved online at http://www.ocpip.org/data/ocpip_wp_SystemC_Communication_Modeling_2002.pdf (2002).
Henricksson, D., et al., "TrueTime 1.2—Reference Manual," pp. 7-79 (2004).
Holz, E., "SDL-2000 Tutorial," Formal Methods Europa., pp. 1-49 (2001).
Hzeeland.nl, "Introduction to VHDL—A Tutorial," retrieved online at http://www.hzeeland.nl/~wrijker/dsy/vhdl/algemvhdl/fcmi/vhdlintro.html (2005).
International Engineering Consortium,"Specifications and Description Language (SDL)," retrieved online at http://www.iec.org/online/tutorials/acrobat/sdl.pdf (2005).
Information Science Institute, "The Network Simulator—ns-2," retrieved online at http://www.isi.edu/nsnam/ns/ (2005).
Lee, Jin-Shyan et al., "A Multi-Paradigm Modeling Approach for Hybrid Dynamic Systems," IEEE International Symposium on Computer Aided Control Systems Design, pp. 77-82 (2004).
Liu, J., et al., "Component-based hierarchical modeling of systems with continuous and discrete dynamics," CACD'00, pp. 1-10 (2000).
Liu, J., et al., "Actor-oriented control system design: A Responsible framework perspective," IEEE Transactions on Control Systems Technology, vol. 12(2):250-62 (2004).
Liu, J et al., "Motivating hierarchical run-time models for measurement and control systems," Ptolemy Miniconference, Berkeley, CA, Mar. 22-23, 2001; 1-3.
Liu, J., et al., "System-level modeling of continuous and discrete dynamics," Ptolemy Miniconference, Berkeley, CA, Mar. 22-23, 2001; 1-4.
Mangeruca, Leonardo et al., "System Level Design for Embedded Controllers: Knock Detection, a Case Study in the Automotive Domain," Design, Automation and Test in Europe Conference and Exhibition, pp. 232-237 (2003).
Martin, D.E., et al., "Analysis and simulation of mixed-technology VLSI systems," Journal of Parallel and Distributed Computing, vol. 62:468-93 (2002).
Martin, R.C., "UML tutorial: Sequence diagrams," Engineering Notebook Column, Apr. 1998, 1-5.
MathWorks, "Stateflow and Stateflow Coder, For Complex Logic and State Diagram Modeling," User's Guide, Version 5, 868 pages (2003).
MathWorks, "Stateflow for Use with Simulink , User's Guide, Version 1," The MathWorks, Inc., 477 pages (1998).
Mosterman, J.P., et al., "Modeling petri nets as local constraint equations for hybrid systems using ModelicaTM," 1-6.
Mosterman, Pieter et al., "Panel Discussion: Challenges and Solution Techniques for Hybrid Simulation," retrieved online at: http://control.bu.edu/ieee/cdc04.cdc04sessions.html (2004).
Murata, T., "Petri nets: Properties, analysis and applications," Proceedings of the IEEE, vol. 77(4):541-80 (1989).
Music, G. et al., "Combined simulation for process control: extension of a general purpose simulation tool," Computers in Industry, vol. 38:79-92 (1999).
Naumann, Rolf, "Graphical design environment for CAMeL-Tools," http://wwwcs.uni-paderborn.de/SFB376/projects/c1/Paper/vcamel.html. Sep. 18-20, 1996; 1-10 (1996).
OPNET Technologies, Inc., "Modeler, Accelerating Network R&D," retrieved at www.opnet.com (2004).
Overhauser, D., et al., "Evaluating mixed-signal simulators," IEEE, pp. 113-120 (1995).
Overhauser, D., et al., "IDSIM2: An Environment for mixed-mode simulation," IEEE, vol. 5(2):1-4 (1990).
Perumalla, Kalyan et al., "Using reverse circuit execution for efficient parallel simulation of logic circuits," retrieved online at http://www.cc.gatech.edu/~kalyan/papers/rccircuit-spie02.pdf (2001).
Rensselaer Polytechnic Institute,"Parallel Discrete Event Simulation," retrieved online at http://www.rpi/edu/~gucluh/pdes.html (2005).
Pimental, J.R., "A Data Model for Intelligent Automation Systems," IEEE International Workshop on Intelligent Robots and Systems, pp. 509-514 (1990).
Rockwell Automation, "IEC 1131 Sequential Function Charts," retrieved online at http://www.software.rockwell.com/corporate/reference/Iec1131/sfc.cfm (2007).
Shamsuddin, Shuhaimi bin et al., "Design of Virtual Instrument for Radio Telemetry Station," Student Conference on Research and Development Proceedings, pp. 414-417 (2002).
Siegmund, Robert et al., "Efficient Modeling and Simulation of Data Communication Protocols in Communication-oriented Designs using the SystemCSV Extension," retrieved online at http://www-ti.informatik.uni-tuebingen.de/~systemc/Documents/Presentation-4-UP5_siegmund.pdf (2003).
SIMUL8 Corporation, "SIMUL8 Feature Tour," retrieved online at http://www.simul8.com/products/features/ (2005).
SIMUL8 Corporation, "SIMUL8 Professional—Normally $4995 but $3995 til May 31," retrieved online at http://simul8-online.com/products/s8prof.htm (2005).
System C Version 2.0 Users Guide, "Update for SystemC 2.0.1," 1996-2002, Chapter 1, pp. 1-8; Chapter 2, pp. 9-38; Chapter 5, pp. 71-82.
The Almagest, vol. 1—Ptolemy 0.7 User's Manual, Ptolemy, Mar. 3, 1997; Sections 1.4-1.9, 2.5-2.8, 4.9, 9.1-9.5, 12.1-12.4, 16.1, 16.3 (1997).
Vlach, M., "Modeling and simulation with Saber," IEEE, T-11.1-11.9 (1990).
Zeigler, B.P., et al., "Creating simulations in HLA/RTI using the DEVS modeling framework," DEVS/HLA Tutorial, 1-8 (1998).
European Search Report for Application No. 05798355.3-2224, 6 pages, dated Dec. 12, 2007.

(56) References Cited

OTHER PUBLICATIONS

International Search Report for Application No. PCT/US2005/033849, 9 pages, dated Aug. 1, 2006.

Bhattacharyya, Shuvra et al., The Almagest, vol. 1—Ptolemy 0.7 User's Manual, University of California at Berkeley, 532 pages (1997).

Leroy et al. "Polymorphic type inference and assignment" Proc. 18th Symp. Principles of Programming Languages, 1991, pp. 291-302.

Co-pending U.S. Appl. No. 12/723,271, filed Mar. 12, 2010, titled "Graphical Modeling Blocks That Execute in More Than One Domain", 50 pages.

* cited by examiner

150

GRAPHICAL MODELING BLOCKS THAT EXECUTE IN MORE THAN ONE DOMAIN

RELATED APPLICATIONS

This application is a continuation application of U.S. application Ser. No. 12/723,271, filed Mar. 12, 2010, which is a continuation in part of U.S. application Ser. No. 11/024,148, filed Dec. 21, 2004, which claims priority to U.S. Provisional Patent Application Ser. No. 60/611,571, filed Sep. 20, 2004, the contents of which are herein incorporated by reference.

BACKGROUND INFORMATION

A hybrid graphical model of a dynamic system may include one or more of graphical components from at least two different domains. For example, a hybrid Discrete Event System model may include time-driven components that may be modeled using a time domain modeling and simulation environment, e.g. Simulink®, and event-driven components that may be modeled using an event domain modeling and simulation environment, e.g. SimEvents®. Existing techniques do not support the use of graphical building blocks for one domain in other domains. Each domain must have a copy of the graphical building block, although the functionality of the copied blocks is similar or even the same in all domains. The existing techniques are incapable of automatically integrating or reusing functional blocks in multiple execution domains without requiring manual reconfiguration of the blocks.

BRIEF DESCRIPTION OF THE DRAWINGS

The accompanying drawings, which are incorporated in and constitute a part of this specification, illustrate one or more embodiments of the invention and, together with the description, explain the invention. In the drawings.

DETAILED DESCRIPTION

Figure 1A:
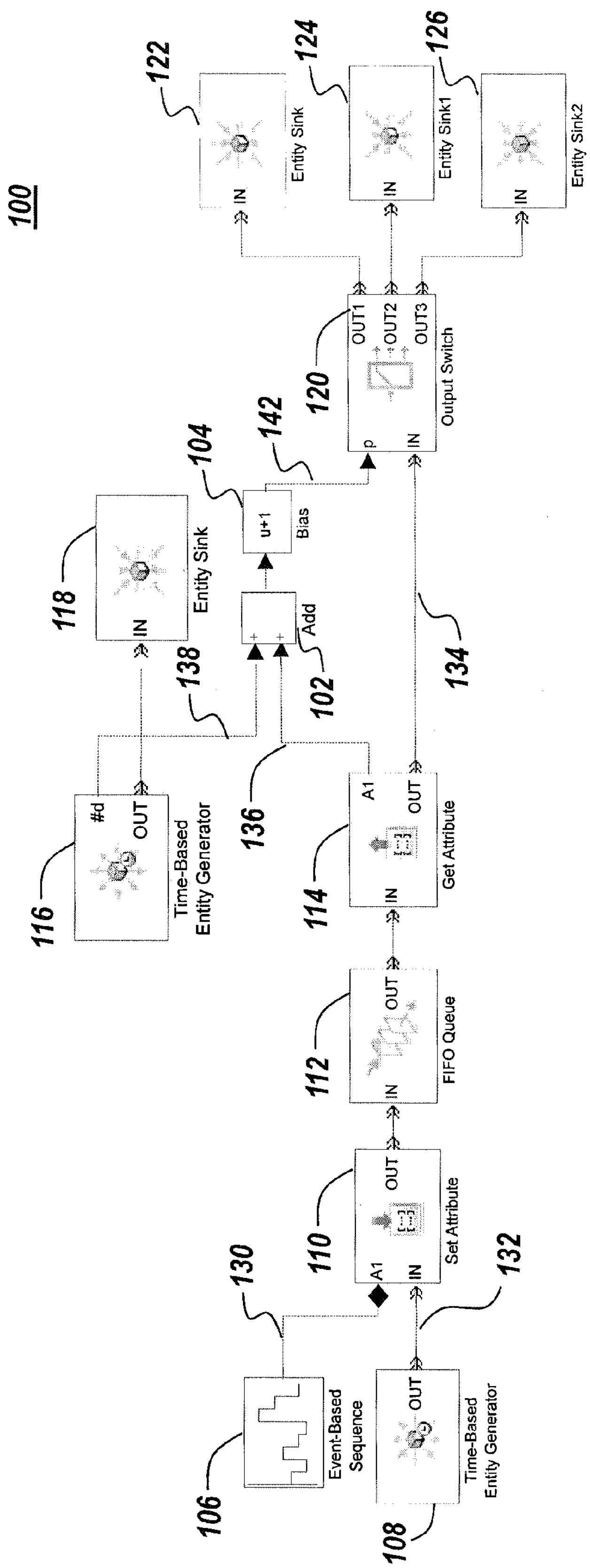
FIG. 1A illustrates an exemplary block diagram model including a plurality of time-driven components and a plurality of event-driven components.

Exemplary embodiments may allow a block to execute in a first domain of a block diagram model or in a second domain as defined by signal connectivity. For example, exemplary embodiments may enable a time-driven block of a block diagram model to execute in an event domain. The user may build a block diagram model and connect a time-driven block to an event-driven block using event domain signals. In an exemplary embodiment, the time-driven block automatically adapts to the execution rules of the event domain. The blocks that are configured to execute in more than one modeling and simulation environment are referred to as "polymorphic blocks". In an embodiment, polymorphic blocks are identified during the compilation stage of the block diagram model. The domain in which a polymorphic block executes is propagated to the block from other blocks in the model via signal connectivity. The domain is not determined by model hierarchy and is solely determined by signal connectivity. After determining the execution domain of a polymorphic block, the block ports, line styles, and other graphical annotations may be updated to provide the user with information on which domain the block is executing in. The execution rules of the polymorphic blocks are also determined during the compilation stage of the block diagram model. The execution rules determine the execution domain of the polymorphic blocks.

One of ordinary skill in the art will appreciate that the application is not limited to time and event domains and can be expanded to other execution domains including, but not limited to, Discrete-Event, Discrete-Time, Continuous-Time, Stateflow®, Dataflow and Hardware Definition Language (HDL) simulation environments.

As used herein, a domain defines a set of execution rules that are enforced during execution of the block diagram model provided in a given domain. For example, in an event domain, during the execution of an event-driven graphical model, the state transitions depend on asynchronous discrete incidents called events. As such, the execution rules of an event-driven graphical model are controlled by the event occurrences. On the other hand, in a time domain, a time-driven graphical model is based on differential equations where time is an independent variable. As such, the execution rules of a time-driven graphical model are controlled by elapsed time.

A graphical model, e.g. a block diagram model, may be created or provided in a time domain modeling and simulation environment, e.g. Simulink®, and/or an event domain modeling and simulation environment, e.g. SimEvents®. Exemplary embodiments are discussed in connection with executable block diagram models created and executed in the Simulink® and SimEvents® environments. The illustrative embodiments will be described solely for illustrative purposes relative to a multi-domain graphical modeling environment provided by the software products from The MathWorks, Inc. of Natick, Mass. Although the illustrative embodiments will be described relative to a SimEvents® and/or Simulink®-based application, including the use of the MATLAB® programming environment, one of ordinary skill in the art will appreciate that the illustrative embodiments may be applied to other event domain modeling and simulation environments and/or time domain modeling and simulation environments, such as but not limited to an environment using software products of LabVIEW® or MATRIXx from National Instruments, Inc., MSC.Adams® from MSC.Software Corporation of Santa Ana, Calif., Virtuoso from Cadence of San Jose, Calif., Dymola from Dynasim AB of Lund, Sweden, Rational Rose from IBM of White Plains, N.Y., Mathematica® from Wolfram Research, Inc. of Champaign, Ill., Mathcad from Mathsoft Engineering & Education Inc., Maple™ from Maplesoft, a division of Waterloo Maple Inc, or Extend from Imagine That, Inc. True Time freeware.

According to various embodiments, a block diagram model may include Discrete Event System (DES) components. The execution of a DES block is driven by asynchronous discrete incidents called "events". A primary data component within exemplary DES components is an "entity". An entity is an item that passes from component to component of a block diagram model provided in the DES modeling environment. For example, when modeling a digital network, an entity may represent a data packet. In another example, when modeling a manufacturing plant, entities may take the form of individual items on the assembly line.

In a block diagram model, DES components are interconnected using block connectors that pass entities and other information between components. The information may include information from other models or data sources or references that have some contribution to the creation or operation of the entities as they pass through the DES components. The components may also have block connectors that pass information out to other models or data sources outside of the DES model. In accordance with various embodiments, DES components may be graphically illustrated with graphical cues such as line style and port style to graphically indicate the types of interaction between the components. The various line and port styles used in connection with DES components are discussed below in connection with FIG. 2.

The basic operation of the DES components involves passing entities through the components according to instructions in each of the components. The exact sequencing of operations within these components is governed by an event calendar. The event calendar serves to drive the DES components forward by triggering the execution of the next scheduled event in the event calendar. A multi-domain simulation solver may allow for the execution of events in the DES event calendar in light of operations that occur in an external environment. The multi-domain simulation solver is a component of the modeling and simulation environment that determines the next simulation step. The multi-domain simulation solver may be in communication with the external environment and may notify the external environment of events within the DES environment which may affect the states of the external environment. During the simulation of DES components, the simulation clock is advanced to the next event time with no state changes until the execution of the next event. As such, the simulation of the DES components, future events are not completely known until the current events are completed.

In accordance with various embodiments of the present application, a block diagram model may be provided in the DES environment. The block diagram model may include one or more time-driven blocks and one or more event-driven blocks, e.g. DES components. An exemplary block diagram model that includes blocks that may execute in both a time domain and an event domain modeling and simulation environment is illustrated in FIG. 1A. Block diagram model 100 illustrated in FIG. 1A includes a plurality of time-driven blocks 102, 104 that execute in a time domain modeling and simulation environment. Block diagram model 100 further includes a plurality of event-driven blocks 106, 108, 110, 112, 114, 116, 118, 120, 122, 124, 126 that execute in an event domain modeling and simulation environment. Event-driven blocks 106, 108, 110, 112, 114, 116, 118, 120, 122, 124, 126 are exemplary DES components. An overview of the various blocks of block diagram model 100 is provided below.

As illustrated, set attribute block 110 has two input ports: input port "A1" and input port "IN". Event-based sequence block 106 provides a first input to the first input port "A1" of set attribute block 110. Event-based sequence block 106 generates entities when events of a specified type occur. On the other hand, time-based entity generator block 108 generates entities using intergeneration times that satisfy user-specified criteria. The intergeneration time is the time interval between two successive event generations.

Time based entity generator block 108 provides a second input to the second input port "IN" of set attribute block 110. Set attribute block 110 accepts one or more entities, assigns data to each entity, and then outputs the entity. The assigned data is stored in the attributes of the entity, where each attribute has a name and a value. The output of set attribute block 110 is provided to FIFO queue block 112. FIFO queue block 112 stores a plurality of entities, e.g. N entities, in sequence for an undetermined length of time. FIFO queue block 112 attempts to output an entity through the output port "OUT", but retains the entity if the output port is blocked. If FIFO queue block 112 stores multiple entities and no entity times out, then entities depart in a first-in, first-out (FIFO) fashion. The input port "IN" of FIFO queue block 112 is unavailable whenever FIFO queue block 112 stores exactly N entities. In this case, the queue is said to be full.

The entity that leaves FIFO queue block 112 is provided at the single input port "IN" of get attribute block 114. Get attribute block 114 has two output ports: output port "A1" and output port "OUT". The output port "A1" of get attribute block 114 provides an input to time-driven add block 102. The output port "A1" of get attribute block 114 outputs signals using data from attributes of entities provided at the input port. For each arriving entity, get attribute block 114 updates the signal at the signal output ports using values of the attributes of the input signal. Get attribute block 114 also outputs the unchanged entity at the output port "OUT". The output port "OUT" of get attribute block 114 provides input to input port "IN" of output switch block 120.

As illustrated in FIG. 1A, time-based entity generator block 116 provides a second input at a second input port of add block 102. Add block 102 adds the two input signals and provides the sum at the output port of add block 102. Time-based entity generator has a second output port "OUT". The entities provided at the output port "OUT" of time-based entity generator block 116 are sent to the input port "IN" of entity sink 118 where the entities are terminated. A bias is added by bias block 104 to the output of add block 102, e.g. the sum of the two event domain signals provided at the input ports of add block 102. The output of bias block 104 is sent to the second input port "p" of output switch 120. Output switch 120 compares the two event domain signals provided at the input ports "IN" and "p". Output switch 120 then provides an output at one of its three output ports "OUT1", "OUT2" or "OUT3". The outputs are sent to respective entity sink blocks 122, 124, 136, where the entities are terminated.

In FIG. 1A, the ports of event-driven blocks 106, 108, 110, 112, 114, 116, 118, 120, 122, 124, 126 have known and fixed port types. The execution rules of event-driven blocks 106, 108, 110, 112, 114, 116, 118, 120, 122, 124, 126 are fixed and pre-defined. Thus, event-driven blocks 106, 108, 110, 112, 114, 116, 118, 120, 122, 124, 126 only operate in the event domain modeling and simulation environment. On the other hand, the execution rules of time-driven blocks 102, 104 blocks are determined during the compilation stage of the block diagram model.

Blocks 102, 104 may operate both in the time domain modeling and simulation environment and the event domain modeling and simulation environment. Blocks 102, 104 are referred as "polymorphic" blocks. Block diagram model 100 including the polymorphic add block 102 and bias block 104 may execute in the event domain. For example, in FIG. 1A, add block 102 executes in the event domain. The execution semantics of the event domain differ from the time domain. For example, in the block diagram 100, add block 102 executes whenever the inputs (138 and 136) to the block change. If, during the execution of the event domain blocks, get attribute block 114 updates its A1 output, add block 102 will execute using the new value outputted by the output port A1 of get attribute block 114 and the prior value of the output port #d of entity generator block 116. After add block 102 executes, bias block 104 executes. This process continues following the event domain semantics. However, add block 102 and bias block 104 may also execute in the time domain, depending on which components of the block diagram are connected to blocks 102, 104. In the time domain, an add block only executes when the block has a time hit and the change of data at the input ports of the block does not necessarily cause the add block to execute.

Figure 1B:
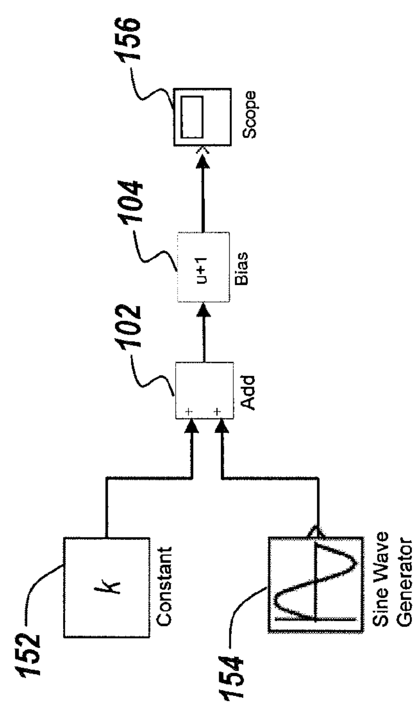
FIG. 1B illustrates an exemplary time domain block diagram model.

For example, add block 102 and bias block 104 may execute in time-driven domain if these blocks are connected to time-driven components in a block diagram model. FIG. 1B illustrates a time domain block diagram model 150 that includes add block 102 and bias block 104. Block diagram model 150 includes two time-driven source blocks, constant block 152 and sine wave generator block 154. The outputs of the time-driven source blocks are provided to respective input ports of add block 102. Since the inputs of add block 102 are time-driven, the output of add block 102 will also be time-driven. The time-driven output of add block 102 is provided to bias block 104. The output of bias block 104 is displayed to the user using scope block 156. In FIG. 1B, all components of block diagram model 150 are time-driven. As such, block diagram model 150 including add block 102 and bias block 104 may be executed in time domain.

In order to understand how the polymorphic blocks and the execution rules of the polymorphic blocks are determined, it is helpful to better understand some background on how modeling is done. Modeling of a block diagram model can include four stages: editing, compiling, linking, and executing, i.e. simulation. During the editing stage, the block diagram model is generated using one or more time-driven components and one or more event-driven components in the graphical modeling and simulation environment. The components are interconnected to indicate information exchange therebetween. During the compiling and linking stages of the block diagram model, an "in-memory executable" version of the block diagram model is produced. The in-memory executable version of the block diagram model is used for generating code and simulating the block diagram model.

The compiling stage involves checking the integrity and validity of the interconnections of the components of the block diagram model. In the linking stage, the result of the compiling stage is used to allocate memory needed for executing the various components of the block diagram model. After linking is performed, code may be generated for the block diagram model. Executing the code in the computing device is referred as executing or simulating the block diagram model.

A system evaluates a block diagram model to determine how to interpret a polymorphic block. The system determines whether the block should be executed in a time domain or an event domain modeling and simulation environment during the compiling stage of the block diagram model. There are various rules that help the system determine if a block is a polymorphic block, i.e. if the block may execute in more than one modeling and simulation environments, and related execution rules. For example, if all the input ports of a polymorphic block are connected to event domain signals, the polymorphic block operates in the event domain. Moreover, if a polymorphic block operates, i.e. executes, in the event domain, all the outputs of the polymorphic block are event domain signals and they are connected to event-driven components. If a polymorphic block has one input port connected to an event domain signal and one input port connected to a non-event domain signal, e.g. a time domain signal, the block is not a polymorphic block and hence cannot execute in the event domain. The modeling and simulation environment may generate an error message indicating that the block cannot execute in the event domain.

Figure 3:
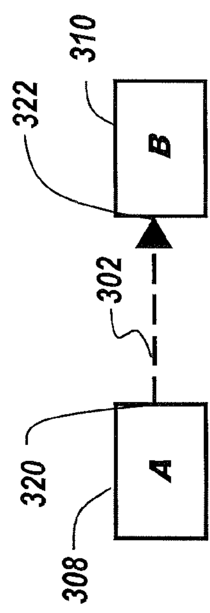
FIG. 3 illustrates exemplary visual cues illustrating a reactive signal.
Figure 2:
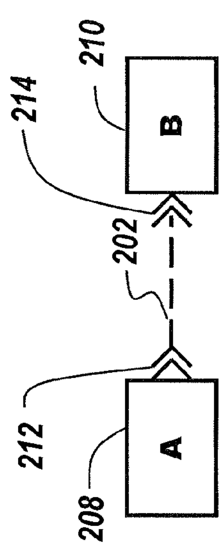
FIG. 2 illustrates exemplary visual cues illustrating an entity path.
Figure 4:
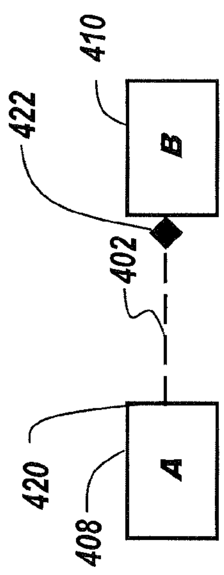
FIG. 4 illustrates exemplary visual cues illustrating a notify signal.

The foregoing rules for polymorphic blocks may use ports of components and line connections between components of the block diagram model to determine the appropriate execution domain for the polymorphic blocks. In a block diagram model, blocks may be interconnected using different visual cues, such as different port and line styles. FIGS. 2-4 illustrate a few examples of the visual cues that may be used in a block diagram model. One of ordinary skill in the art will appreciate that these visual cues are for illustrative purposes only and should not be construed as limiting.

FIGS. 2-4 illustrate three types of lines 202, 302, 402 connecting a first block, i.e. Block A and a second block, i.e. Block B. As illustrated in FIGS. 2-4, in an event domain modeling and simulation environment, event domain signals may be illustrated using dashed lines. Solid lines may be reserved to illustrate non-event domain signals, e.g. time domain signals. The port styles of blocks may visually indicate a different set of execution rules for the first block and the second block.

For example, as illustrated in FIG. 2, the first port style may illustrate an entity path 202. In FIG. 2, entity path 202 is shown using a dashed line connecting an entity output port 212 (shown as ">>" at the output side of first block 208) and an entity input port 214 (shown as ">>" at the input side of second block 210). Entity path 202 may model a directional path for entities to travel from first block 208 to second block 210.

The second port style illustrated in FIG. 3 may represent a reactive signal 302. Reactive signals 302 are also known as "push" signals. In FIG. 3, reactive signal 302 is illustrated using a dashed line connecting a signal output port 316 and an event-driven reactive signal input port 318 (shown as a filled triangle). If a reactive signal 302 connects output port 316 of first block 308 and reactive input port 318 of second block 310, an update at output port 316 of first block 308 will cause second block 310 to execute during the simulation of the block diagram model.

The third port style illustrated in FIG. 4 may represent a notify signal 402. Notify signals 402 are also known as "pull" signals. In FIG. 4, notify signal 402 is shown using a dashed line connecting signal output port 420 of first block 408 and event-driven notify signal input port 422 (shown as a filled diamond) of second block 410. If a notify signal 402 connects output port 420 of first block 408 and notify input port 422 of second block 410, first block 408 never actively updates its output signal unless second block 410 requests an update. Upon a request from second block 410, first block 408 executes and updates its output value during the simulation of the block diagram model. The updated value is then read by second block 410.

The above described methods and visual cues may be applied to FIG. 1A to determine which blocks of the block diagram model 100 illustrated in FIG. 1A are polymorphic blocks. As illustrated by the specific port icon provided at input port "A1" of set attribute block 110, signal 130 is a notify signal. The port styles associated with lines 132 and 134 indicate that these lines illustrate entity paths. Similarly, looking at the line and port styles associated with signals 136, 138, 140, 142, it is determined that signals 136, 138, 140, 142 are reactive signals.

In view of the foregoing, at the compilation time of block diagram 100, it is determined that both input ports of add block 102 receive event-driven reactive signals from output port "#d" of time-based entity generator block 116 and output port "A1" of get attribute block 114, respectively. Thus, all input ports of add block 102 are connected to event domain signals. Accordingly, add block 102 is determined to be a polymorphic block and may execute in the event domain.

Add block 102 outputs a reactive signal that is sent to bias block 104. As such, the input port of bias block 104 is connected to an event domain reactive signal. Bias block 104 in turn is determined to be a polymorphic block that may execute in the event domain. Bias block 104 outputs an event domain reactive signal that is sent to event-driven output switch block 120. In the block diagram 100 of FIG. 1A, blocks 102, 104 are determined to be polymorphic blocks that may execute in the event domain modeling and simulation environment. All remaining blocks of block diagram model 100, i.e. blocks other than add block 102 and bias block 104, are event-driven blocks that have known port and line style at their input and/or output ports. All components of the block diagram model 100 may execute in the event domain. As such, during the execution of the multi-domain graphical model 100, it is not necessary to switch execution domains to execute all components of the multi-domain graphical model 100.

One of skill in the art will appreciate that the foregoing discussion of a time domain and event domain modeling and simulation environment is for illustrative purposes and should not be construed as limiting. The first domain and the second domain may be selected from a variety of different modeling and simulation domains. Specifically, the foregoing discussion may be a bi-directional modeling and simulation environment where it is also possible to incorporate an event-driven block into a block diagram model that is configured to execute in the time domain. The event-driven block may be determined to be a polymorphic block based on the connection of the event-driven block to the remaining blocks of the block diagram model, as discussed above. If the event-driven block is determined to be a polymorphic block, the event-driven block may execute in the time domain while preserving its functionality. That is, the event-driven block will have the same functionality regardless of whether the event-driven block executes in the event domain or the time domain.

The foregoing method of identifying polymorphic blocks used the various port and line connections of the block diagram model. Alternatively or in addition to the foregoing method, a list of polymorphic blocks may be provided in accordance with various embodiments. During the compilation stage of the block diagram model, the system may compare the blocks of the block diagram model to the blocks of the polymorphic blocks list to determine which blocks may be polymorphic blocks. Polymorphic blocks may also be grouped based on their execution domains. For example, a first list of polymorphic blocks may include blocks that execute in both the time domain and the event domain. A second list of polymorphic blocks may include blocks that execute in event domain and any other non-event domain, etc.

Examples of polymorphic blocks include blocks from the Simulink® Logic and Bit Operation library, Simulink® Math Operations library and Simulink® Ports and Subsystems library, among other blocks from various block libraries. One of ordinary skill in the art will appreciate that the block libraries that include polymorphic blocks are not limited to those provided above and that various block libraries may be used in connection with the teachings of the present application.

Figure 5:
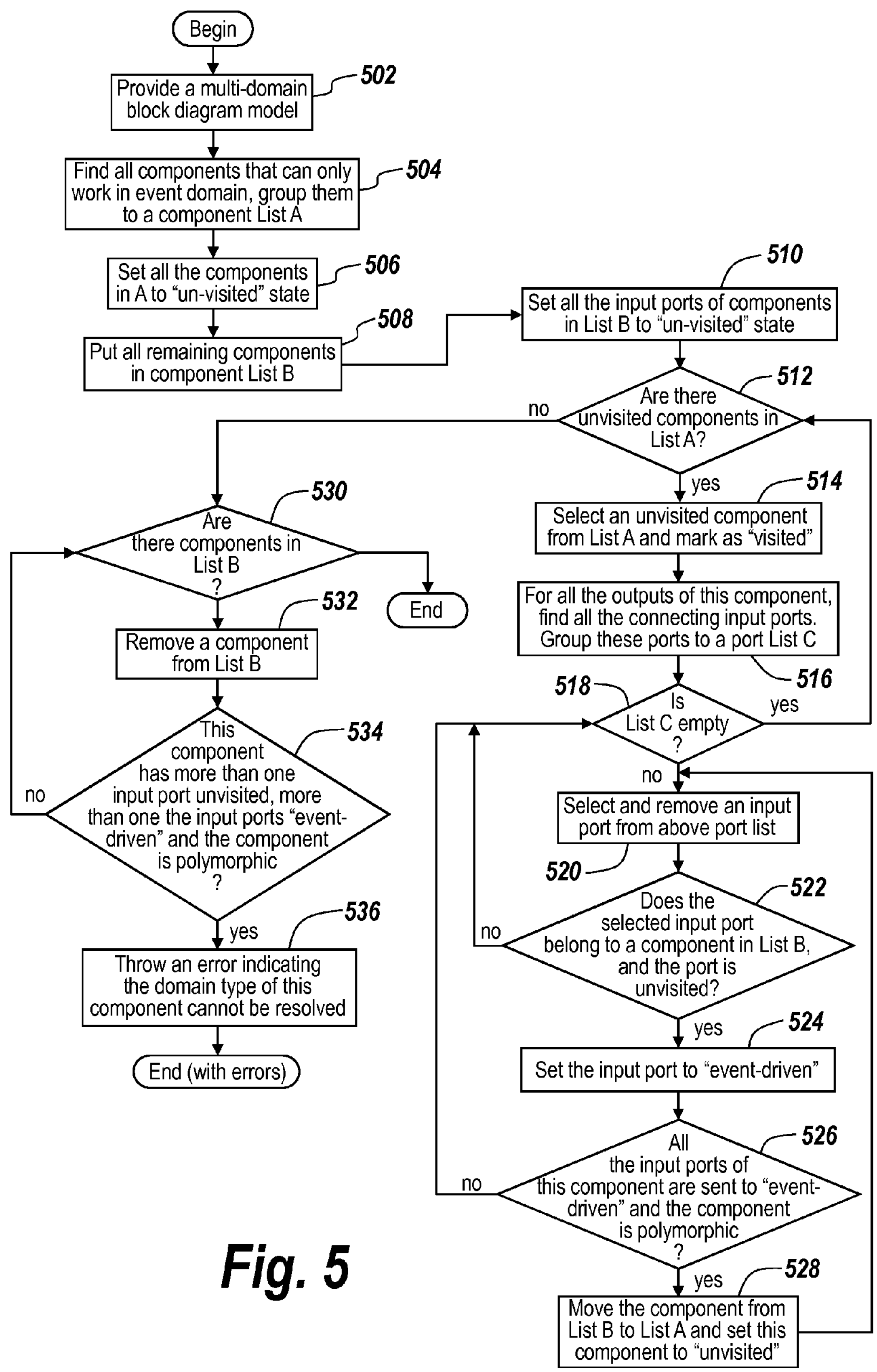
FIG. 5 illustrates a flowchart describing processing for identifying polymorphic blocks and the associated execution rules in an exemplary block diagram model.

FIG. 5 illustrates a flowchart 500 of steps employed to identify polymorphic blocks and associated execution rules in an exemplary block diagram model. A multi-domain block diagram model comprising one or more time-domain components and one or more event-domain components is provided (step 502). One of ordinary skill in the art will appreciate that the use of time and event domain are for illustrative purposes. The steps of the flowchart 500 may be used with any two different domains. The components of the multi-domain block diagram model that that are configured to execute only in the event domain are grouped into a component list, e.g. List A (step 504). The components of List A are set to an "un-visited" state to indicate that none of these components has been analyzed (step 506). All the remaining components, i.e. components that may execute in domains other than the event domain, are grouped into a second component list, e.g. List B (step 508). The components of List B are also set to an "un-visited" state to indicate that none of these components has been analyzed (step 510). List B may include components that can only execute in a non-event domain as well as components that can execute both in the event domain and in a non-event domain. The analysis of the block diagram continues with identifying which components of List B are polymorphic components, i.e. components that can execute both in the event domain and in a non-event domain.

The analysis algorithm checks if there are any unvisited components in List A (step 512). If there are unvisited components in List A, the analysis algorithm selects an unvisited component from List A and marks it as "visited" (step 514). The selected component is analyzed to determine the connecting input ports to which all the output ports of the selected component are connected. The determined input ports are grouped into a port list, e.g. List C (step 516). The search algorithm checks if List C is empty, i.e. whether all determined ports are analyzed (step 518). If there are un-analyzed input ports, the analysis algorithm selects an input port and removes the selected input port from List C for analysis (step 520). If the selected input port does not belong to a component in List B, the search algorithm returns to step 518. If the selected input port belongs to a component in List B, the input port is set to "event-driven" state to indicate that the input port accepts event domain signals (steps 522 and 524). If all the input ports of the selected component are set to "event-driven" state and the component is polymorphic, the component is moved from List B to List A to indicate that the component may execute in the event domain (step 528). If all the input ports of the selected component are not set to "event-driven" state and the component is not a polymorphic component, the search algorithm returns to step 518.

If there are no unvisited components in List A, the analysis algorithm checks if there are any components in List B (step 530). If List B is empty, the analysis algorithm ends the analysis. If there are components in List B, the analysis algorithm removes a component from List B (step 532). The selected component is analyzed to determine if the component has more than one input port that is unvisited, more than one input port that is set to be "event-driven" and that the component is polymorphic (step 534). If the answer to step 534 is negative, i.e. no, the analysis algorithm returns to step 530. If the answer to step 534 is affirmative, i.e. yes, the analysis algorithm throws an error indicating that the domain type of the selected component cannot be resolved (step 536).

According to the various embodiments of the present application, a user may build a block diagram model and connect a time-driven block to an event-driven block using event domain signals. The time-driven block will automatically adapt to the discrete-event execution rules defined by the event domain modeling and simulation environment. The ability to use time-driven blocks in the event domain modeling and simulation environment enables seamless integration and re-use of time-driven blocks in the event domain modeling and simulation environment.

Figure 6:
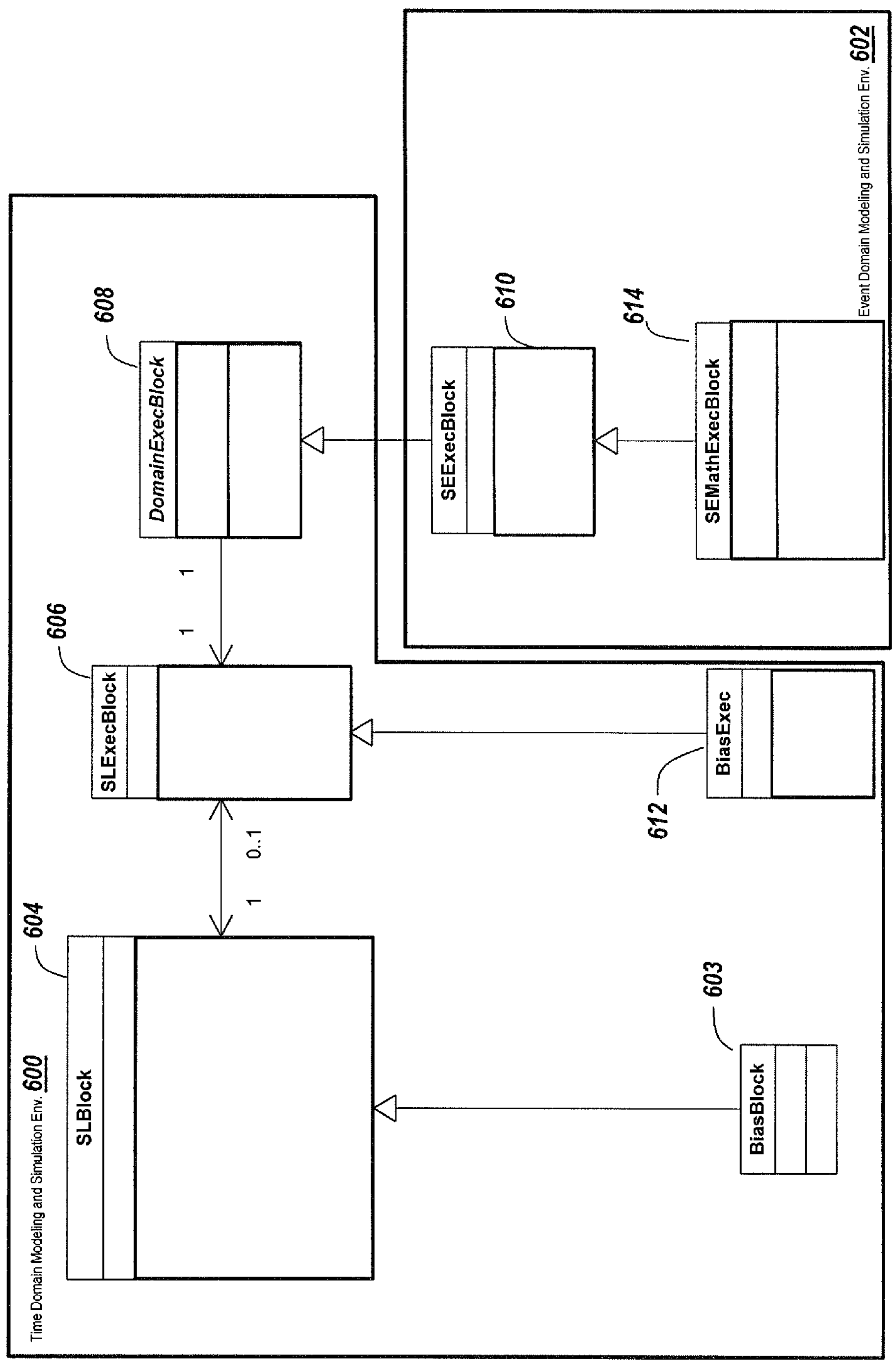
FIG. 6 illustrates an exemplary interaction between a time domain modeling and simulation environment and an event domain modeling and simulation environment in accordance with exemplary embodiments.

In some exemplary embodiments, the time domain modeling and simulation environment and the event domain modeling and simulation environment may have a number of object classes that help to support the use of polymorphic blocks. FIG. 6 illustrates some of the object classes for polymorphic blocks. In addition, FIG. 6 shows an exemplary interaction between objects in a time domain modeling and simulation environment 600 and objects in an event domain modeling and simulation environment 602 for a polymorphic block in accordance with exemplary embodiments. A number of object classes are provided for the polymorphic block in the time domain modeling and simulation environment 600. Similarly, a number of object classes are provided for the polymorphic block in the event domain modeling and simulation environment 602.

FIG. 6 shows some of the object classes that are formed for a polymorphic "bias" block, like bias block 104 shown in FIG. 1A. SLBlock 604 is the base class for all blocks in a block diagram model that provide edit-time and compile-time services to the blocks. BiasBlock 603 is a derived class of SLBlock 604 for the bias block. BiasBlock 603 defines edit-time and compile-time features of the bias block. SLExecBlock 606 is the base class for all blocks in a block diagram model that provide simulation-time services to the blocks. BiasExec 612 is a derived class of SLExecBlock 606 for the bias block. BiasExec 612 defines simulation-time features of the bias block. BiasExec 612 object is associated with BiasBlock 603 so that the bias block can access results of edit-time/compile-time features during simulation of the block diagram model. BiasBlock 603 object is associated with a BiasExec block 612 if the simulation engine determines to execute this block during simulation. The BiasBlock 603 object enables edit-time/compile-time features to refer to the simulation-time instance when needed.

The bias block is a polymorphic block. When the bias block works in the event domain modeling and simulation environment 602, the event domain modeling and simulation environment 602 creates an event domain execution block object of base class type SEExecBlock 610 for the polymorphic block. The event domain execution block object defines the execution features of the polymorphic block when the polymorphic block is in the event domain modeling and simulation environment 602. DomainExecBlock 608 is created to form the parent class for all execution block objects of all types of simulation environments. The parent class may own or be responsible for a collection of children objects. DomainExecBlock 608 provides services that are common to the execution of a block in all types of execution environments. SEExecBlock 610 is the base class for all event domain execution block objects. SEExecBlock 610 defines the common simulation-time block features of event-driven blocks. The SEMathExecBlock 614 is a special type of event domain execution block that defines how blocks like a bias block executes in the event domain modeling and simulation environment. SEMathExecBlock 614 class may define the execution of a broad set of polymorphic blocks, such as Bias, Gain, Add blocks, etc.

During the compilation stage of a block diagram model, if a time-driven bias block is identified as working in the event domain modeling and simulation environment 602, the event domain modeling and simulation environment 602 creates an instance of SEMathExecBlock 614 for the bias block. The event domain modeling and simulation environment 602 further associates SEMathExecBlock 614 with the BiasExec 612 object. During the simulation stage, when the event domain environment determines to execute the bias block, the SEMathExecBlock 614 instance invokes related computational features on BiasExec 612 block.

Figure 7:
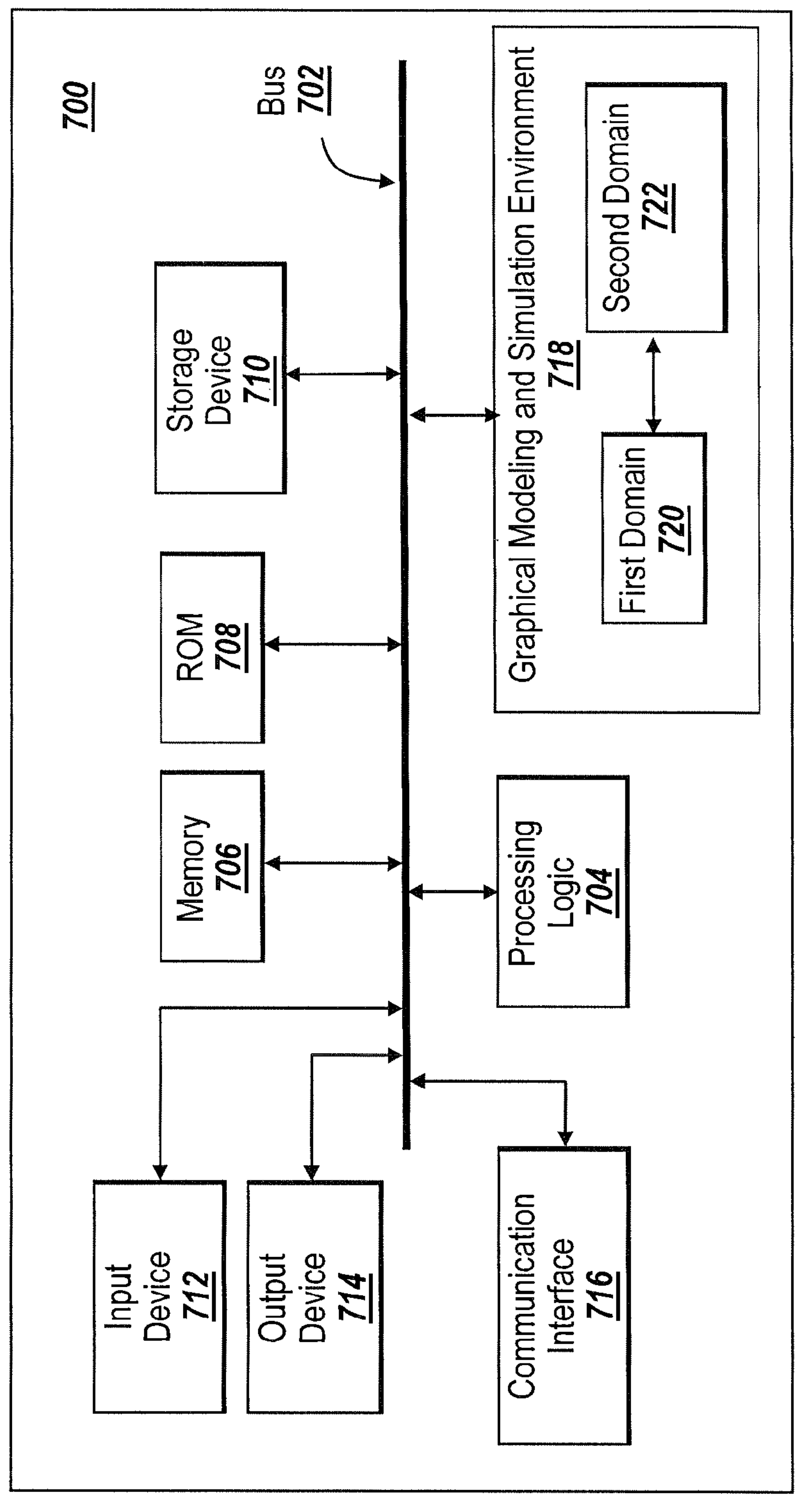
FIG. 7 illustrates an exemplary computing device that may be used to implement the illustrative embodiments described herein.

FIG. 7 illustrates an exemplary computer architecture 700 that can be used to implement the illustrative embodiments discussed above. FIG. 7 is an exemplary diagram of a computing device 700 that includes a bus 702, processing logic 704, a main memory 706, a read-only memory (ROM) 708, a storage device 710, an input device 712, an output device 714, and/or a communication interface 716. Bus 702 may include a path that permits communication among the components of the computing device 700.

Processing logic 704 may include a processor, microprocessor, or other types of processing logic that may interpret and execute instructions. In one implementation, processing logic 704 may include a single core processor or a multi-core processor. In another implementation, processing logic 704 may include a single processing device or a group of processing devices, such as a processor cluster or computing grid. In still another implementation, processing logic 704 may include multiple processors that may be local or remote with respect each other, and may use one or more threads while processing.

Main memory 706 may include a random access memory (RAM) or another type of dynamic storage device that may store information and instructions for execution by processing logic 704. ROM 708 may include a ROM device or another type of static storage device that may store static information and/or instructions for use by processing logic 704. Storage device 710 may include a magnetic, solid state and/or optical recording medium and its corresponding drive, or another type of static storage device that may store static information and/or instructions for use by processing logic 704.

Input device 712 may include logic that permits an operator to input information to the entity, such as a keyboard, a mouse, a pen, a touchpad, an accelerometer, a microphone, voice recognition, camera, neural interface, biometric mechanisms, etc. Output device 714 may include a mechanism that outputs information to the operator, including a display, a printer, a speaker, etc. Communication interface 716 may include any transceiver-like logic that enables the entity to communicate with other devices and/or systems. For example, communication interface 716 may include mechanisms for communicating with another device or system via a network.

The computing device 700 depicted in FIG. 7 may perform certain operations in response to processing logic 704 executing software instructions contained in a tangible computer-readable medium, such as main memory 706. A tangible computer-readable medium may be defined as a physical or logical memory device. The software instructions may be read into main memory 706 from another computer-readable storage medium, such as storage device 710, or from another device via communication interface 716. The software instructions contained in main memory 706 may cause processing logic 704 to perform processes described herein when the software instructions are executed on processing logic.

Alternatively, hardwired circuitry may be used in place of or in combination with software instructions to implement processes described herein. Thus, implementations described herein are not limited to any specific combination of hardware circuitry and software.

As illustrated in FIG. 7, the computing device 700 may include a graphical modeling and simulation environment 718. The graphical modeling and simulation environment 700 may include multi-domain graphical modeling and simulation environments to support multi-domain graphical models. For example, the graphical modeling and simulation environment 718 may include a first domain graphical modeling and simulation environment 720 and a second domain graphical modeling and simulation environment 722. According to various embodiments, the first domain graphical modeling and simulation environment 720 may be a time domain graphical modeling and simulation environment. According to various embodiments, the second domain graphical modeling and simulation environment 722 may be an event domain graphical modeling and simulation environment. The first domain graphical modeling and simulation environment 720 may communicate with the second domain graphical modeling and simulation environment 722 when simulating a multi-domain block diagram model as discussed above.

Although FIG. 7 shows exemplary components of the computing device, in other implementations, the computing device 700 may contain fewer, different, or additional components than depicted in FIG. 7. In still other implementations, one or more components of the entity may perform one or more tasks described as being performed by one or more other components of the computing device 700.

Figure 8:
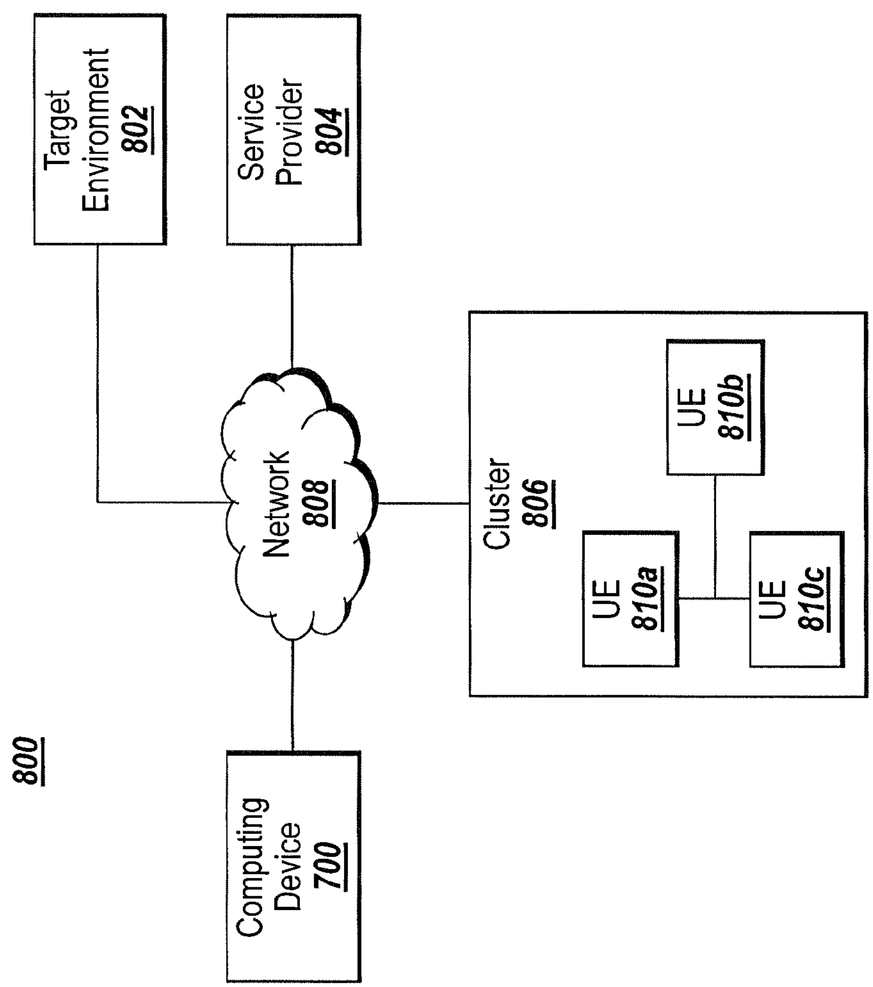
FIG. 8 illustrates a distributed computing environment that may be used to implement the illustrative embodiments described herein.

One or more embodiments of the invention may be implemented in a distributed environment. FIG. 8 illustrates an example of a distributed environment 800 that may be configured to implement one or more embodiments of the invention. Referring to FIG. 8, environment 800 may contain various entities including computing device 700, target environment 802, service provider 804, cluster 806, and network 808. Note that the distributed environment 800 is just one example of a distributed environment that may be used with the illustrative embodiments discussed above. Other distributed environments that may be used with the illustrative embodiments may contain more computing devices, fewer computing devices, computing devices in arrangements that differ from the arrangement illustrated in FIG. 8. Moreover, the distributed environments may be configured to implement various cloud computing frameworks.

Details of computing device 700 were described above with respect to FIG. 7. In distributed environment 800, computing device 700 may be configured to, among other things, exchange information (e.g., data) with other entities on network 808 (e.g., target environment 802, service provider 804, and cluster 806). Computing device 700 may interface with the network 808 via a communication interface.

Target environment 802 may be configured to execute and/or interpret a compiled version of a model, e.g. a multi-domain graphical model, which may be generated in or otherwise available to the distributed environment 800. The network 808 may include a communication network capable of exchanging information between the entities in the network 808. The network 808 may include digital and/or analog aspects. The information may include machine-readable information having a format that may be adapted for use, for example, in the network 808 and/or with one or more entities in the network 808. For example, the information may be encapsulated in one or more packets that may be used to transfer the information through the network 808.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, etc.

The network 808 may include various network devices, such as gateways, routers, switches, firewalls, servers, repeaters, address translators, etc. Portions of the network 808 may be wired (e.g., using wired conductors, optical fibers, etc.) and/or wireless (e.g., using free-space optical (FSO), radio frequency (RF), acoustic transmission paths, etc.). Portions of network 808 may include a substantially open public network, such as the Internet. Portions of network 808 may include a more restricted network, such as a private corporate network or virtual private network (VPN).

It should be noted that implementations of networks and/or devices operating on networks described herein are not limited with regards to, for example, information carried by the networks, protocols used in the networks, and/or the architecture/configuration of the networks.

Service provider 804 may include logic that makes a service available to another entity in the distributed environment 800. Service provider 804 may also include a server operated by, for example, an individual, a corporation, an educational institution, a government agency, and so on, that provides one or more services to a destination, such as computing device 700. The services may include software containing computer-executable instructions that implement one or more embodiments of the invention or portions thereof, and may be executed, in whole or in part, by (1) a destination, (2) the service provider 704 on behalf of the destination, or (3) some combination thereof.

For example, in an embodiment, service provider 804 may provide one or more subscription-based services that may be available to various customers. The services may be accessed by a customer via network 808. The customer may access the services using a computer system, such as computing device 700. The services may include services that implement one or more of the illustrative embodiments discussed above or portions thereof. Service provider 804 may limit access to certain services based on, e.g., a customer service agreement between the customer and service provider 804.

The service agreement may allow the customer to access the services that may allow the customer to build, execute, and/or analyze a model, such a multi-domain graphical model, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly, etc.). For services not included in the package, the customer may have to pay an additional fee in order to access the services. Still other arrangements may be resource-usage based. For example, the customer may be assessed a fee based on an amount of computing resources and/or network bandwidth used.

Cluster 806 may include a number of units of execution (UEs) 810 that may perform processing of one or more embodiments of the invention or portions thereof on behalf of computing device 700 and/or another entity, such as service provider 804. The UEs 810 may reside on a single device or chip or on multiple devices or chips. For example, the UEs 810 may be implemented in a single ASIC or in multiple ASICs. Likewise, the UEs 810 may be implemented in a single computer system or multiple computer systems. Other examples of UEs 810 may include FPGAs, CPLDs, ASIPs, processors, multiprocessor systems-on-chip (MPSoCs), graphic processing units, microprocessors, etc. The UEs 810 may be configured to perform operations on behalf of another entity.

Exemplary embodiments may include or may be implemented in a technical computing environment that includes hardware and/or hardware-software based logic. The logic may provide a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In one implementation, the technical computing environment may include a dynamically typed language that can be used to express problems and/or solutions in mathematical notations familiar to those of skill in the relevant arts. For example, the technical computing environment may use an array as a basic element, where the array may not require dimensioning. These arrays may be used to support array programming in that operations can apply to an entire set of values, such as values in an array. Array programming may allow array based operations to be treated as a high-level programming technique or model that lets a programmer think and operate on whole aggregations of data without having to resort to explicit loops of individual non-array, i.e., scalar operations.

The technical computing environment may further be adapted to perform matrix and/or vector formulations that can be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

The technical computing environment may further provide mathematical functions and/or graphical tools (e.g., for creating plots, surfaces, images, volumetric representations, etc.). In one implementation, the technical computing environment may provide these functions and/or tools using toolboxes (e.g., toolboxes for signal processing, image processing, data plotting, parallel processing, optimization, etc.). In another implementation, the technical computing environment may provide these functions as block sets (e.g., an optimization block set). In still another implementation, the technical computing environment may provide these functions in another way, such as via a library, etc. The technical computing environment may be implemented as a text based environment, a graphically based environment, or another type of environment, such as a hybrid environment that is both text and graphically based.

For example, a text-based embodiment may implement the technical computing environment using one or more text-based products. For example, a text-based technical computing environment (TCE), may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim; AnyLogic from XJ Technologies; the TrueTime freeware. The text-based TCE may support one or more commands that support remote processing using one or more units of execution or other types of remote processing devices.

A graphically-based embodiment may implement the technical computing environment in a graphically-based technical computing environment using products such as, but not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; Ptolemy from the University of California at Berkeley; or aspects of a Unified Modeling Language (UML) or SysML environment. The graphically-based TCE may support remote processing using one or more units of execution or other types of remote processing devices.

Implementations may provide a modeling environment that allows polymorphic blocks to adapt to different modeling domains depending on domains associated with other blocks connected to the polymorphic blocks.

The foregoing description of exemplary illustrative embodiments provides illustration and description, but is not intended to be exhaustive or limiting to the precise form disclosed. Modifications and variations are possible in light of the above teachings.

In addition, implementations consistent with the foregoing principles can be implemented using devices and configurations other than those illustrated in the figures and described in the specification without departing from the spirit of the invention. Further, disclosed implementations may not be limited to any specific combination of hardware.

Further, certain portions of the invention may be implemented as "logic" that performs one or more functions. This logic may include hardware, such as hardwired logic, an application-specific integrated circuit, a field programmable gate array, a microprocessor, software, or a combination of hardware and software.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

Headings and sub-headings used herein are to aid the reader by dividing the specification into subsections. These headings and sub-headings are not to be construed as limiting the scope of the invention or as defining the invention.

The scope of the invention is defined by the claims and their equivalents.

What is claimed is:

1. A non-transitory computer-readable storage medium storing instructions, the instructions comprising:

one or more instructions which, when executed by at least one processor, cause the at least one processor to:

receive information associated with a block diagram model, the block diagram model including:

one or more event-driven blocks operating in an event domain, and one or more time-driven blocks operating in a time domain;

group, based on the received information, information associated with the one or more event-driven blocks in a first list;

group, based on the received information, information associated with the one or more time-driven blocks in a second list, the second list being different than the first list;

analyze, from the first list, information associated with an event-driven block, of the one or more event-driven blocks to determine:

one or more output ports of the event-driven block, and one or more input ports that are connected to the one or more determined output ports;

determine, using the determined one or more input ports, if an input port, of the determined one or more input ports, is associated with the grouped information in the second list;

set, when the input port is associated with the grouped information in the second list, the input port to an event-driven state; and execute, based on setting the input port to the event-driven state, a time block, of the one or more time-driven blocks, in the event domain, the time block connected to the input port.

2. The medium of claim 1, where the event-driven block includes:

a plurality of input ports, and a plurality of output ports.

3. The medium of claim 2, where the plurality of input ports are connected to one or more time domain signals.

4. The medium of claim 2, where the instructions further include:

one or more instructions to generate an error message when:

a first input port of the plurality of input ports of the event-driven block is connected to a time domain signal, and a second input port of the plurality of input ports of the event-driven block is connected to a non-time domain signal.

5. The medium of claim 1, where the at least one event-driven block is a polymorphic block that can execute in the time domain and in the event domain.

6. A non-transitory computer-readable storage medium storing instructions, the instructions comprising:

one or more instructions which, when executed by at least one processor, cause the at least one processor to:

receive first information associated with a block diagram model, the block diagram model including:

one or more event-driven blocks operating in an event domain, and one or more time-driven blocks operating in a time domain;

group, based on the received first information, information associated with the one or more event-driven blocks in a first list;

receive second information associated with the one or more time-driven blocks in a second list, the second list being different than the first list;

analyze, from the first list, information associated with an event-driven block, of the one or more event-driven blocks, to determine:

one or more output ports of the event-driven block, and one or more input ports that are connected to the one or more determined output ports; and determine, using the determined one or more input ports, if an input port, of the determined one or more input ports, is associated with the grouped information in the second list;

set, when the input port is associated with the grouped information in the second list, the input port to an event-driven state; and execute, based on setting the input port to the event-driven state, a time block, of the one or more time-driven blocks, in diagram model in the time domain, the executing including executing the one of the one or more event driven blocks in the event domain, the time block connected to the input port.

7. The medium of claim 6, where the event-driven block includes:

a plurality of input ports, and a plurality of output ports.

8. The medium of claim 7, where the instructions further include:

one or more instructions to generate an error message when:

a first input port of the plurality of input ports of the event-driven block is connected to a time domain signal, and a second input port of the plurality of input ports of the event-driven block is connected to a non-time domain signal.

9. The medium of claim 7, where the event-driven block is a polymorphic block that can execute in the time domain and in the event domain.

10. A method comprising:

receiving information associated with a block diagram model, the block diagram model including:

one or more event-driven blocks operating in an event domain, and one or more time-driven blocks operating in a time domain, and the receiving being performed by a computing device;

grouping, based on the received information, information associated with the one or more event-driven blocks in a first list, the grouping being performed by the computing device;

grouping, based on the received information, information associated with the one or more time-driven blocks in a second list, the second list being different than the first list, and the grouping the information associated with the one or more time-driven blocks in the second list being performed by the computing device;

analyzing, from the first list, information associated with an event-driven block, of the one or more event-driven blocks, to determine:

one or more output ports of the event-driven block, and one or more input ports that are connected to the one or more determined output the analyzing being performed by the computing device;

determining, using the determined one or more input ports, if an input port, of the determined one or more input ports, is associated with the grouped information in the second list, the determining being performed by the computing device;

setting, when the input port is associated with the grouped information in the second list, the input port to an event-driven state, the setting being performed by the computing device; and executing, based on setting the input port to the event-driven state, a time block, of the one or more time-driven blocks, in the event domain, the time block connected to the input port, and the executing being performed by the computing device.

11. The method of claim 10, where the block diagram model executes in the time domain.

12. The method of claim 10, where the event-driven block includes:

a plurality of input ports, and a plurality of output ports.

13. The method of claim 12, where the plurality of input ports are connected to one or more time domain signals.

14. The method of claim 12, further comprising:

generating an error message when:

a first input port of the plurality of input ports of the event-driven block is connected to a time domain signal, and a second input port of the plurality of input ports of the event-driven block is connected to a non-time domain signal.

15. The method of claim 10, where the event-driven block is a polymorphic block that can execute in the time domain and in the event domain.

16. A method comprising:

grouping first information associated with one or more event-driven blocks of a block diagram model to form a first list, the grouping being performed by a computing device;

grouping second information associated with one or more time-driven blocks of the block diagram model to form a second list, the second list being different than the first list, and the grouping the second information being performed by the computing device;

analyzing, from the first list, information associated with an event-driven block, of the one or more event-driven blocks, to determine:

one or more output ports of the event-driven block, and one or more input ports that are connected to the one or more determined output, the analyzing being performed by the computing device;

determining, using the determined one or more input ports, if an input port, of the determined one or more input ports, is associated with the grouped information in the second list, the determining being performed by the computing device;

setting, when the input port is associated with the grouped information in the second list, the input port to an event-driven state, the setting being performed by the computing device; and executing, based on setting the input port to the event-driven state, a time block, of the one or more time-driven blocks, diagram model in the event domain, the time block connected to the input port, and the executing being performed by the computing device.

17. The method of claim 16, where the event-driven block includes:

a plurality of input ports, and a plurality of output ports.

18. The method of claim 17, further comprising:

generating an error message when:

a first input port of the plurality of input ports of the event-driven block is connected to a time domain signal, and a second input port of the plurality of input ports of the event-driven block is connected to a non-time domain signal.

19. The medium of claim 6, where the instructions further include:

one or more instruction to move, based on setting the input port to the event-driven state, the information associated with the event-driven block from the second list to the first list.

20. The method of claim 16, further comprising:

moving, based on setting the input port to the event-driven state, the information associated with the event-driven block from the second list to the first list.

* * * * *